(12) United States Patent
Mikolajick

(10) Patent No.: US 7,227,219 B2
(45) Date of Patent: Jun. 5, 2007

(54) CHARGE TRAPPING MEMORY CELL AND FABRICATION METHOD

(75) Inventor: Thomas Mikolajick, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/055,584

(22) Filed: Feb. 10, 2005

(65) Prior Publication Data

US 2005/0189582 A1  Sep. 1, 2005

(30) Foreign Application Priority Data

Feb. 10, 2004  (DE)  .................. 10 2004 006 505

(51) Int. Cl.
*H01L 29/76* (2006.01)
*H01L 21/8238* (2006.01)

(52) U.S. Cl. ............... 257/324; 257/319; 257/329; 257/330; 257/316; 257/335; 257/295; 257/298; 257/314; 257/315

(58) Field of Classification Search ............... None
See application file for complete search history.

(56) References Cited

U.S. PATENT DOCUMENTS

| | | | |
|---|---|---|---|
| 5,045,490 A | 9/1991 | Esquivel et al. | |
| 5,467,305 A | 11/1995 | Bertin et al. | |
| 5,468,663 A | 11/1995 | Bertin et al. | |
| 5,617,351 A | 4/1997 | Bertin et al. | |
| 5,768,192 A | 6/1998 | Eitan | |
| 5,970,341 A | 10/1999 | Lin et al. | |
| 6,011,288 A | 1/2000 | Lin et al. | |
| 6,011,725 A | 1/2000 | Eitan | |
| 6,087,222 A | 7/2000 | Jung Lin et al. | |
| 6,215,148 B1 | 4/2001 | Eitan | |
| 6,348,711 B1 | 2/2002 | Eitan | |
| 6,477,084 B1 | 11/2002 | Eitan | |
| 6,664,588 B2 | 12/2003 | Eitan | |
| 2005/0286296 A1* | 12/2005 | Bollu et al. ............ | 365/185.01 |

FOREIGN PATENT DOCUMENTS

EP  0 562 257 A1  9/1993
WO  WO 99/60631  11/1999

OTHER PUBLICATIONS

Willer, J., et al., "UMEM: A U-shape Non-Volatile-Memory Cell," Nonvolatile Semiconductor Memory Workshop, 2003, p. 42-43.

(Continued)

*Primary Examiner*—Leonardo Andujar
*Assistant Examiner*—Fazli Erdem
(74) *Attorney, Agent, or Firm*—Slater & Matsil, L.L.P.

(57) ABSTRACT

A memory cell patterned as a trench transistor is provided with a first gate electrode (4) as auxiliary gate for source-side injection and a second gate electrode (5) electrically insulated therefrom, which are arranged in the trench, and has, at the trench walls, a storage layer sequence (10) provided for charge trapping and comprising a storage layer (12) between boundary layers (11, 13). The first gate electrode (4) and the second gate electrode (5) are electrically insulated from one another, which can be effected by means of a portion of the storage layer sequence (10). Source/drain regions (3) are arranged on the top side laterally with respect to the trenches. Word lines (6), source/drain lines and control gate lines are present for the electrical driving.

20 Claims, 4 Drawing Sheets

OTHER PUBLICATIONS

Tomiye, H. et al., "A novel 2-bit/cell MONOS memory device with a wrapped-control-gate structure that applies source-side hot-electron injection," IEEE, 2002 Symposium on VLSI Technology Digest of Technical Papers (2 pages).

Pein, H., et al., "A 3-D Sidewall Flash EPROM Cell and Memory Array," IEEE Electron Device Letters, vol. 14, No. 8, Aug. 1993.

Kuo, D-S, et al., "TEAFET—A High Density, Low Erase Voltage, Trench Flash EEPROM," IEEE, 1994 Symposium on VLSI Technology Digest of Technical Papers, pp. 51-52.

Groeseneken, G., et al., "Basics of Nonvolatile Semiconductor Memory Devices," IEEE Press, New York, 1998, S. 21-23.

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

CHARGE TRAPPING MEMORY CELL AND FABRICATION METHOD

This application claims priority to German Patent Application 10 2004 006505.5, which was filed Feb. 10, 2005, and is incorporated herein by reference.

TECHNICAL FIELD

The present invention relates generally to semiconductor devices methods, and more particularly to a charge trapping memory cell and fabrication method.

BACKGROUND

In charge trapping memory cells, which are nonvolatile memory cells based on charge storage between the channel region and/or the source/drain regions and the gate electrode, as part of the gate dielectric, a nonconductive storage layer is present between boundary layers for trapping charge carriers and thus for altering the programming state of the memory cell. Examples thereof include SONOS memory cells (semiconductor-oxide-nitride-oxide-semiconductor; see U.S. Pat. No. 5,768,192, U.S. Pat. No. 6,011,725, PCT Publication WO 99/60631), in which each boundary layer is an oxide and the storage layer is a nitride of the semiconductor material, usually silicon. Charge trapping memory cells are preferably programmed by channel hot electrons (CHE) and can be erased by means of hot holes from the channel region or by Fowler-Nordheim tunneling. An SONOS memory cell provided for a special mode of operation with a read voltage applied in the opposite sense to the programming process (reverse-read), the memory cell having a thickness of the boundary layers that is adapted to this mode of operation, has been referred to as an NROM memory cell (Boaz Eitan et al.: "NROM: A Novel Localized Trapping, 2-Bit Nonvolatile Memory Cell" in IEEE Electron Device Letters 21, 543–545 (2000)).

The scalability of charge trapping memory cells is limited by the fact that, on account of the thicknesses of the dielectric layers required for data retention, i.e., of the storage layer between boundary layers, and owing to the high electrical voltages required, the channel length cannot be reduced in accordance with the minimum feature size possible. One approach to eliminate this problem consists in using a memory component in which the channel region is oriented vertically with respect to the top side of the silicon body and the channel length consequently does not limit the lateral dimensions of the memory cell and thus the required area of the top side of the semiconductor body. The top side of the semiconductor body has to be patterned suitably for such an arrangement of the channel region. This may be done by arranging the structure elements of the memory cell in elevated structures applied on the top side or in trenches in the semiconductor body.

For multi-bit charge trapping memory cells, in particular, in which at least two bits are stored, the variant with a trench transistor is a promising option for reducing the component area taken up. In the case of such a memory cell, the gate electrode is situated in a trench of the semiconductor body, at the top side of which the source/drain regions are formed by introduction of dopant. The gate dielectric, in which the storage layer sequence, for example an ONO storage layer sequence, is present, is situated between the gate electrode and the semiconductor material. The channel region extends around the trench bottom proceeding from the interfaces of the source/drain regions (junctions), thereby achieving a significantly longer channel length than in the case of a planar component. However, this gives rise to the problem that, on account of the non-rectilinear current flow, the electric field maximum does not occur at the interface (unction) of the drain region and, therefore, a targeted programming of a bit in the region of the drain is not ensured. In the case of previous trench transistors, the high field strengths required for programming and erasing the memory cells may lead to a complete depletion of the regions between two adjacent memory cells. In these intermediate regions, it is then no longer possible to control the direction of the hot charge carriers.

The storage layer of a charge trapping memory cell is situated between boundary layers made of a material having a higher energy band gap than the energy band gap of the storage layer, so that the charge carriers trapped in the storage layer remain localized there. A nitride is preferably appropriate as material for the storage layer; an oxide is primarily suitable as the surrounding material. In the example of such an oxide-nitride-oxide (ONO) storage layer sequence in the silicon material system, the storage layer is silicon nitride with an energy band gap of approximately 5 eV; the surrounding boundary layers are silicon oxide with an energy band gap of approximately 9 eV. The storage layer may be a different material whose energy band gap is smaller than the energy band gap of the boundary layers, the difference between the energy band gaps being intended to be as large as possible for good electrical confinement of the charge carriers. In conjunction with silicon oxide as boundary layers, it is possible to use, e.g., tantalum oxide, hafnium silicate, titanium oxide (in the case of stoichiometric composition $TiO_2$), zirconium oxide (in the case of stoichiometric composition $ZrO_2$), aluminum oxide (in the case of stoichiometric composition $Al_2O_3$) or intrinsically conducting (undoped) silicon as material of the storage layer.

The literature discloses programming memory cells by the so-called method of source-side injection. This requires two gate electrodes electrically insulated from one another. By virtue of the fact that the two gate electrodes are driven with electrical voltages that differ significantly from one another, the electric field maximum can be localized to the junction region between the two gate electrodes, so that it is thereby possible to achieve a targeted injection of charge carriers in this region. The literature specified in this respect shall include the publications by G. Groeseneken et al., Basics of Nonvolatile Semiconductor Memory Devices, in W. Brown and J. Brewer, Nonvolatile Semiconductor Memory Technology, IEEE Press, New York, 1998, pages 21 to 22, and H. Tomiye et al., A novel 2-bit/cell MONOS memory device with a wrapped-control-gate structure that applies source-side hot-electron injection.

SUMMARY OF THE INVENTION

In one aspect, the present invention specifies a charge trapping memory cell that has improved programming and erasing properties in conjunction with a small area requirement, and an associated fabrication method.

The memory cell according to the preferred embodiment of the invention involves forming a charge trapping memory cell with the structure of a trench transistor, two gate electrodes electrically insulated from one another being provided in the trench in order to enable programming by source-side injection. This programming mechanism manages with weaker electric fields, lower electric field strengths occurring in particular in the region of the curvature of the channel at the bottom of the trench. Moreover, in preferred configurations, the storage medium is restricted to a narrowly delimited region. This significantly reduces disturbing effects such as, by way of example, the influencing of a second bit stored in the same cell. The arrangement in the trench ensures a small area requirement of the memory cell. The high field strengths are limited to the actual storage region by the programming mechanism of source-side injection. The two gate electrodes arranged in the trench are electrically insulated from one another by a layer made of dielectric material that is coplanar with respect to the top side of the semiconductor body. The bottom gate electrodes respectively present in a relevant trench are continuously electrically interconnected and contact-connected on the top side at the edge of the memory cell array. The top gate electrodes are connected in a manner known per se by means of word lines running transversely with respect to the trenches. The source/drain regions formed between the trenches at the top side of the semiconductor body by implantation of dopant are interconnected in the longitudinal direction of the trenches by buried bit lines formed in the semiconductor material.

BRIEF DESCRIPTION OF THE DRAWINGS

Examples of the charge trapping memory cell and preferred fabrication methods are described in more detail below with reference to the accompanying FIGS. 1 to 8.

Figure 1:
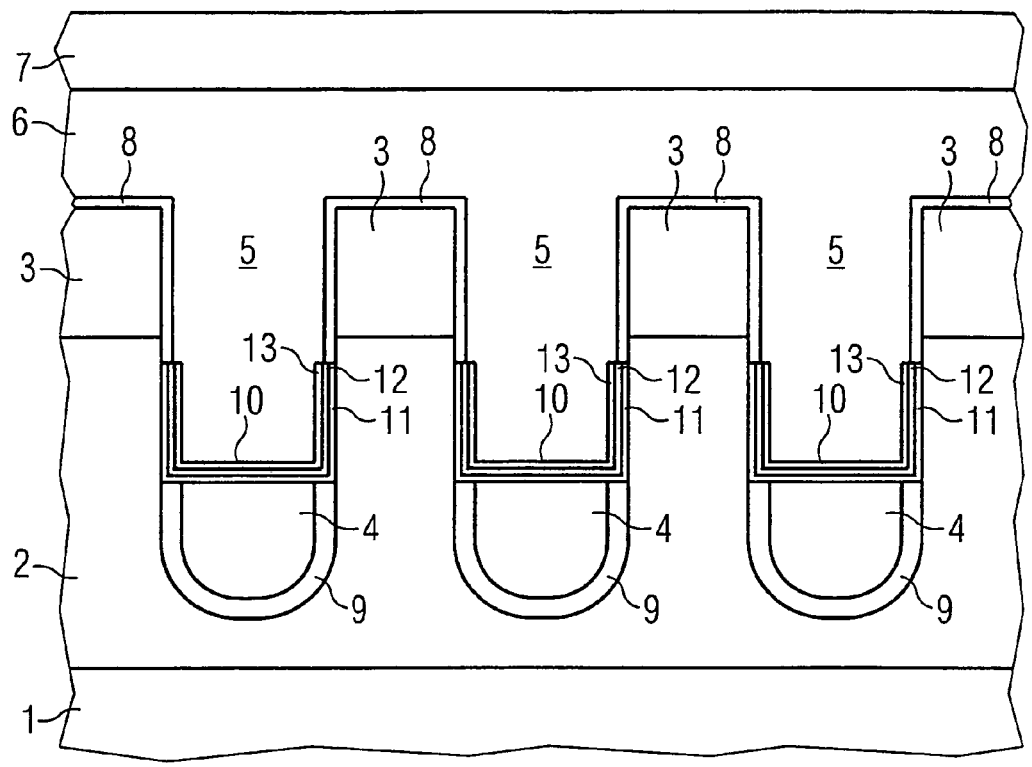
FIG. 1 shows an arrangement of charge trapping memory cells of a preferred exemplary embodiment in cross section.

The following list of reference symbols can be used in conjunction with the figures
1 Semiconductor body
2 Well
3 Source/drain region
4 First gate electrode
5 Second gate electrode
6 Word line
7 Conductor strips
8 Dielectric
9 Gate dielectric
10 Storage layer sequence
11 Boundary layer
12 Storage layer
13 Boundary layer
14 Terminal contact
15 Contact
16 Trench
17 Electrically conductive material
18 Auxiliary layer
CL Control gate line
S/D Source/drain line
WL Word line

DETAILED DESCRIPTION OF ILLUSTRATIVE EMBODIMENTS

FIG. 1 shows a detail from a cross section through a memory cell array formed with the charge trapping memory cells. A doped well 2, preferably p-conducting, is fabricated in a semiconductor body 1, such as a substrate or a semiconductor layer grown on a substrate. Trenches are situated in the well, the transistor structures of the memory cells being formed in the trenches. At the top side of the semiconductor body 1, source/drain regions 3 doped opposite to the conductivity type of the well 2 are situated between the trenches and in a manner adjoining the latter. Situated in the lower region of the trenches are first gate electrodes 4, which are in each case insulated from the semiconductor material of the doped well 2 by a gate dielectric 9. The trenches are formed with curved bottoms, and the entire curved region is covered by the first gate electrodes 4. Second gate electrodes 5 are situated above the first gate electrodes 4 in the trenches. The first gate electrodes and the second gate electrodes are insulated from one another by an intermediate layer made of dielectric material.

In the example illustrated in FIG. 1, there is a storage layer sequence 10 present between the semiconductor material of the doped well 2 and a respective second gate electrode 5 below the source/drain regions 3. The storage layer sequence 10 is also situated between the first gate electrode 4 and the second gate electrode 5 and electrically insulates the latter from one another. The storage layer sequence 10 is provided for charge trapping, and comprises an actual storage layer 12 between boundary layers 11, 13. The storage layer 12 is silicon nitride, for example, while the boundary layers are oxide. However, the materials specified as suitable for charge trapping memory cells in the introduction are also appropriate for the storage layer sequence 10. The second gate electrodes 5 are connected to word lines 6 on the top side, which word lines, in order to reduce the bulk resistance, may be provided with conductor strips 7 made of metal or a metal silicide. The gate electrodes and word lines 6 may be polysilicon. A further dielectric 8 is situated between the semiconductor material and the second gate electrodes 5 and also the word lines 6 for electrical insulation purposes.

In the direction perpendicular to the plane of the drawing in FIG. 1, word lines patterned parallel to one another in strip form succeed one another at intervals. The second gate electrodes 5 are also patterned in accordance with the width of the word lines 6. In contrast to this, the first gate electrodes 4 are electrically conductively connected to one another in the longitudinal direction of the trenches and contact-connected at the edge of the cell array. The first gate electrodes 4 and the connections thereof form control gate lines. These control gate lines may have the same form of their cross-sectional area as the first gate electrodes 4 in FIG. 1 in all sectional areas that are coplanar with respect to the cross section of FIG. 1, with the exception of the periphery of the cell array.

Figure 2:
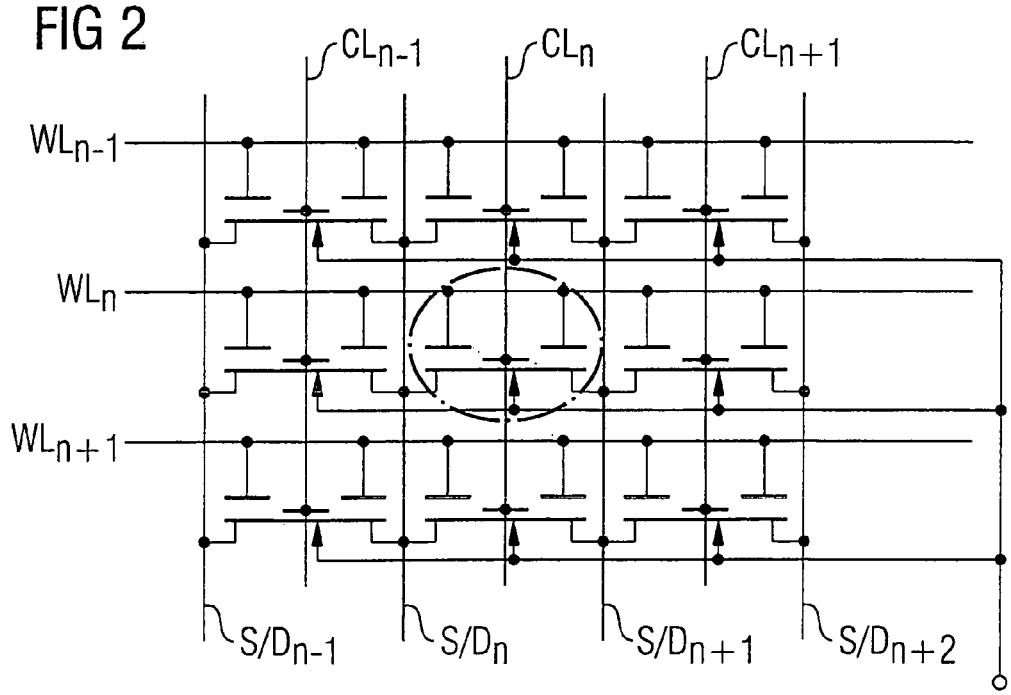
FIG. 2 shows a circuit diagram for a memory cell array formed with the charge trapping memory cells.

FIG. 2 shows the connection diagram for a memory cell array of this type. The region of a memory cell is marked with an oval in FIG. 2. The source/drain regions of the memory cells are connected to one another in columnwise fashion via source/drain lines $S/D_n$. The control gate lines $CL_n$ run parallel thereto and connect the first gate electrodes 4, provided as control gate electrodes, to one another. The word lines $WL_n$ run transversely with respect thereto and connect the second gate electrodes 5, provided for the actual driving of the cells, to one another in rowwise fashion. The connection diagram of FIG. 2 also reveals that these cells are provided in principle for the programming of two bits, on the source side and on the drain side.

The cells are preferably programmed by injection of hot electrons (CHE, channel hot electrons) from the channel region by source-side injection. For this purpose, a voltage lying just above the threshold voltage of the transistor is applied to the relevant first gate electrode as auxiliary gate. A high positive voltage is applied to the relevant word line in order, on the one hand, to set the required maximum of the electric field strength between the first gate electrode and the word line and, on the other hand, to generate hot electrons, that is to say electrons having a high kinetic energy, in the channel region, which pass into the storage layer 12 and remain trapped there. Typical voltage values during programming are, by way of example, 0 volts at source, 4 to 6 volts at drain, 1 to 2 volts at the first gate electrode and 9 volts at the second gate electrode, the word lines of the non-addressed cells remaining at floating potential, at 0 volts or at a negative voltage, while the bit lines of the non-addressed cells are held at floating potential and the first gate electrodes of the non-addressed cells and also the doped well are held at 0 volts.

Erasure can be effected by means of hot holes from the channel or by Fowler-Nordheim tunneling. In the case of erasure by means of hot holes, the following voltages, for example, are applied to the cell to be erased: 0 volts to source, 4 to 6 volts to drain and −9 to −5 volts to the second gate electrode, while the relevant first gate electrode remains at floating potential or is held at 0 volts or a negative voltage. The word lines of the non-addressed cells are put at 0 volts or a positive voltage, while the remaining terminals of the non-addressed cells and of the well are brought to the potentials that are also applied during programming. In the case of erasure by Fowler-Nordheim tunneling, a voltage of −8 to 0 volts is applied to the word line of the cell to be erased and a voltage of 6 to 12 volts is applied to the doped well. Instead of this, erasure may also be effected by displacing electrons from the storage layer into the well by application of a sufficiently high voltage (in the range above 10 volts depending on the thickness of the storage layer sequence) between the doped well and the word line that leads to the memory cell to be erased. A tunneling mechanism is likewise responsible for this. If this type of erasure is chosen, a smaller thickness of the lower boundary layer 11 of typically 2 nm to 3 nm is advantageous.

During reading, a sufficiently high voltage, typically 2 volts, for example, has to be applied both to the first gate electrode and to the second gate electrode, in order to open the channel throughout. In order to be able to separate the two bits at the channel ends, that is to say on the source side and on the drain side, during reading, a sufficiently high voltage is applied via the relevant bit line to source, for example 1 to 2 volts, while drain is at 0 volts, so that the polarity of the source and drain terminals is reversed in comparison with programming (reverse read). The bit lines of the non-addressed cells are at floating potential and the remaining terminals of the non-addressed cells are at 0 volts.

Figure 3:
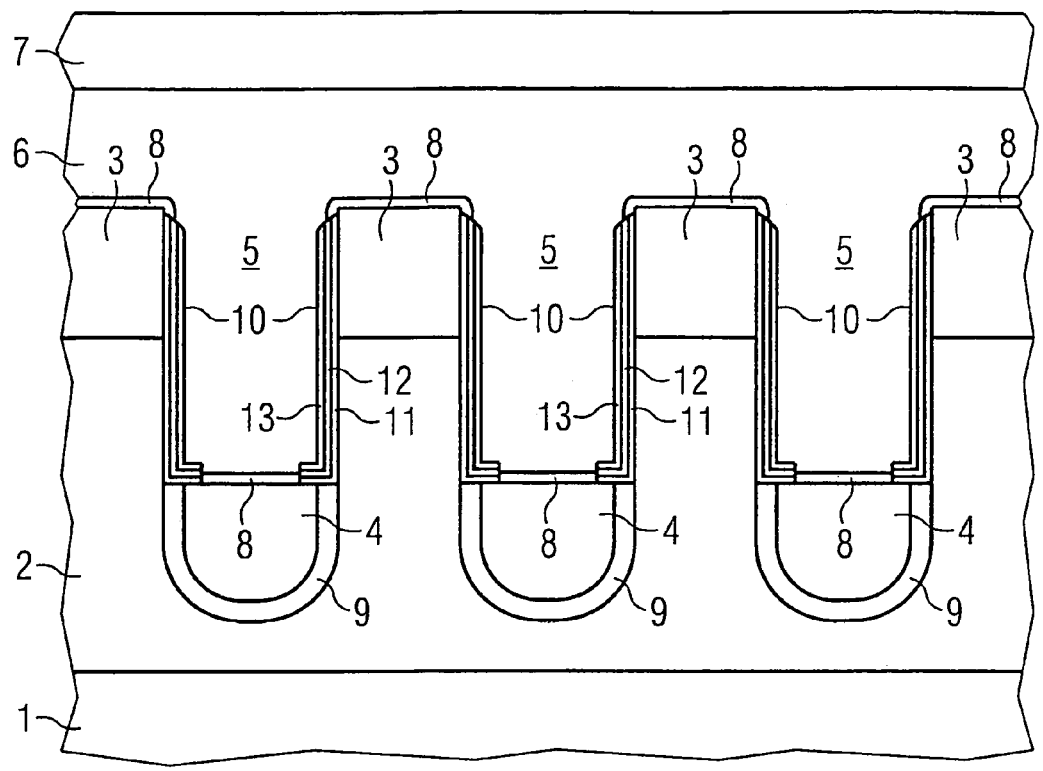
FIG. 3 shows a cross section corresponding to FIG. 1 for a further exemplary embodiment.

FIG. 3 shows a cross section corresponding to the cross section of FIG. 1 for a further exemplary embodiment. The reference symbols correspond to the reference symbols of FIG. 1. In the case of the exemplary embodiment of FIG. 3, the storage layer sequence 10 is situated at the trench walls above the first gate electrodes 4. In this example, the electrical insulation between the first gate electrode 4 and the second gate electrode 5 is effected by the layer of the further dielectric 8, which is also present between the gate electrodes here. The portions of the storage layer sequence 10 are formed in the manner of side wall spacers.

Figure 4:
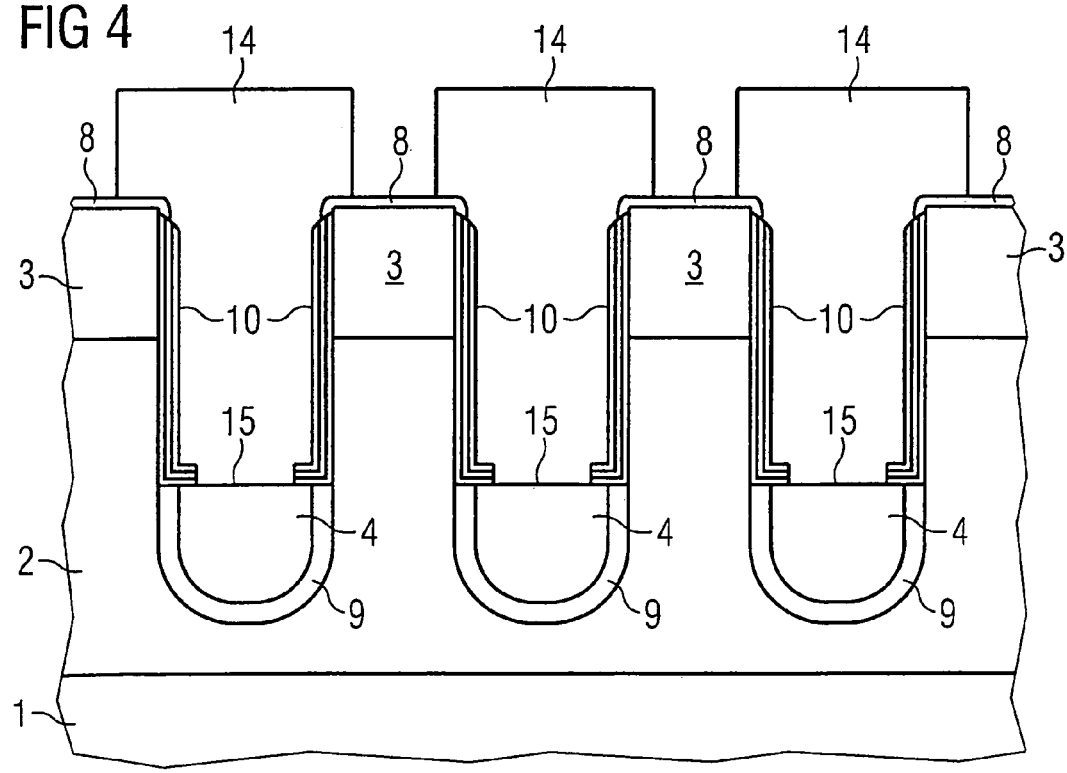
FIG. 4 shows a cross section through an edge of a memory cell array, with terminal contacts of the bottom gate electrodes.

FIG. 4 shows a cross section corresponding to the cross section of FIG. 3 for the edge of the memory cell array. Here the first gate electrodes 4 form the end pieces of the control gate lines, which are provided with terminal contacts 14 in the region of the periphery. In the case of the exemplary embodiment of FIG. 4, the terminal contacts are formed as contact plugs that are electrically conductively connected to the control gate line in contacts 15. For the rest, FIG. 4 shows the exemplary embodiment in accordance with FIG. 3. Terminal contacts in accordance with the cross section of FIG. 4 may also be provided in a corresponding manner in the case of the exemplary embodiment of FIG. 1.

Preferred methods for fabricating the charge trapping memory cell and memory cell arrays constructed therewith are described below with reference to FIGS. 5 to 8.

Figure 5:
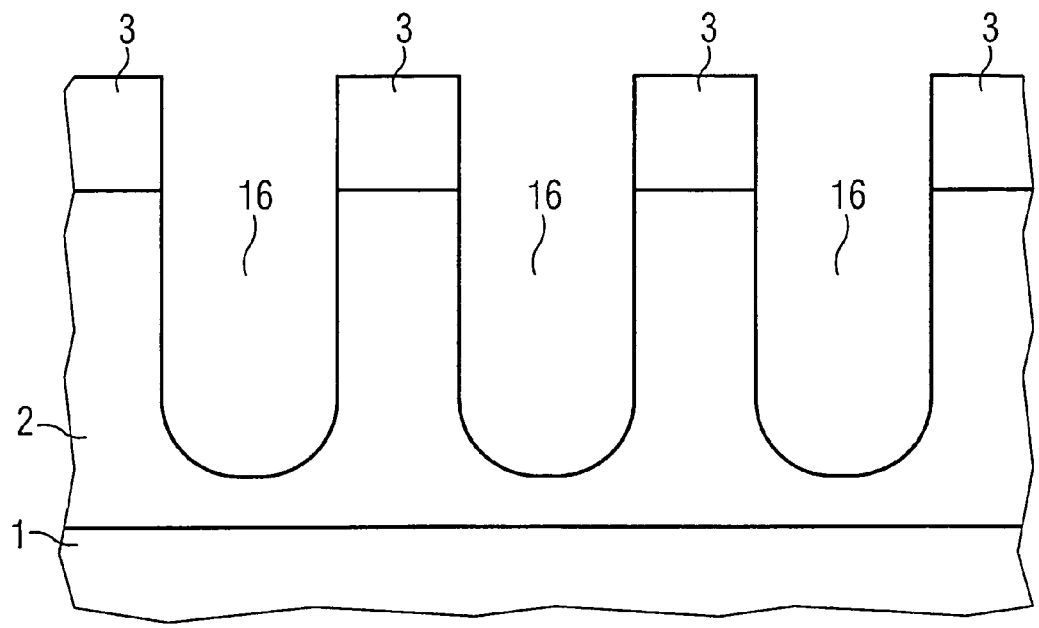
FIG. 5 shows a cross section through an intermediate product of a preferred fabrication method.

FIG. 5 shows a cross section through a semiconductor body 1 or a semiconductor layer with a doped well 2 formed therein. The well 2 is preferably doped in p-conducting fashion. The source/drain regions 3 are formed at the relevant top side of the semiconductor body 1 and are doped for electrical conductivity of the opposite sign with respect to the well 2, that is to say for n-type conduction in the example. The trenches 16 are then etched at a distance from and parallel to one another at the top side. These trenches are provided for the arrangement of the transistor structure forming the memory cells. Process steps known per se for fabricating the driving periphery of the memory cell array are effected in parallel with the method steps described here.

Figure 6:
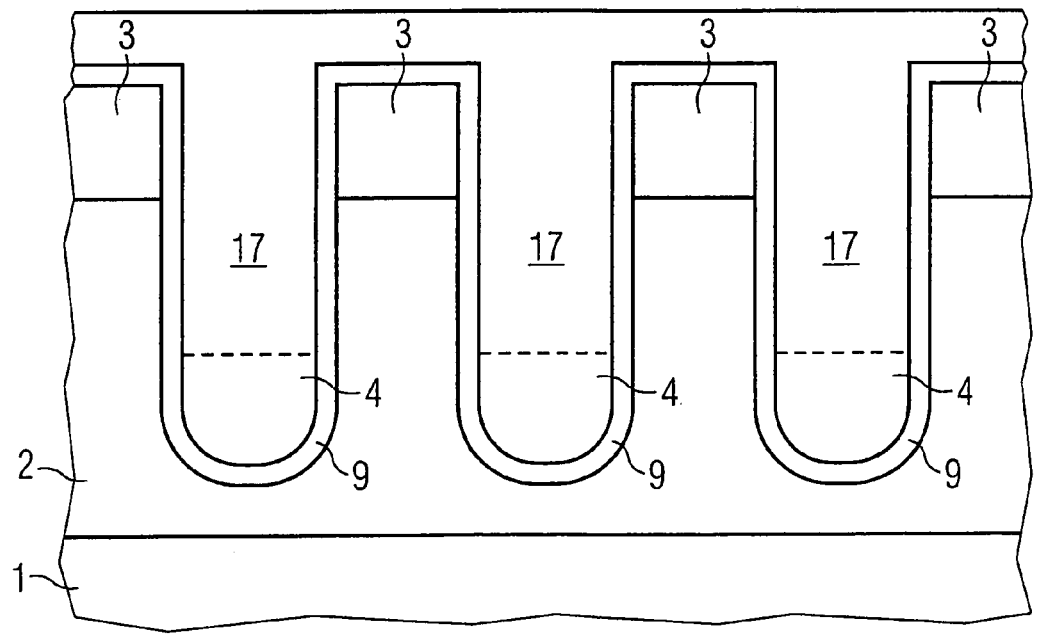
FIG. 6 shows the cross section of FIG. 5 after a later method step.

As illustrated in FIG. 6, in a next method step, the semiconductor surface is provided with a thin layer made of a dielectric, which is provided as gate dielectric 9. This layer may be an oxide, which may be fabricated by oxidation of the semiconductor material, but which may also be applied by means of an oxide deposition. A combination of an initially thin oxidation with a subsequent oxide deposition is also possible. The electrically conductive material 17, preferably polysilicon, provided for the first gate electrodes 4 is then deposited. The dimensioning provided for the first gate electrodes 4 is marked by the dashed horizontal line in FIG. 6. The electrically conductive material 17 is then removed down to the level of this marking. This is done by etching back the material, in which case the top side may be removed and planarized beforehand by CMP (chemical mechanical polishing). Residual portions of the electrically conductive material 17 then remain in the region of the trench bottoms as first gate electrodes 4 and as control gate lines present in between.

The storage layer sequence is then fabricated above the first gate electrodes 4. The dielectric layer provided for the gate dielectric 9 may be used as the lower boundary layer of the storage layer sequence, particularly if an oxide is involved in this case. The top side of the electrically conductive material is in this case separately provided with a dielectric layer. If the material of the first gate electrodes is polysilicon, the polysilicon is preferably thermally oxidized to form a thin oxide layer. Instead of this, however, it is also possible to remove the dielectric above the first gate electrodes 4, preferably wet-chemically, so that the entire storage layer sequence is applied to the semiconductor material. For this purpose, by way of example, an oxide layer may be deposited or produced thermally as the first boundary layer. A layer made of a different one of the materials suitable for the storage layer sequence that were mentioned in the introduction may also be applied here. The advantage of a separate deposition of a corresponding layer having a high relative permittivity resides, on the one hand, in the possibility of freely selecting this material and, on the other hand, in the fact that the thickness of the lower boundary layer 11 can be set independently of the thickness of the gate dielectric 9 in the region of the first gate electrodes 4. However, the process sequence becomes slightly more complicated as a result.

Figure 7:
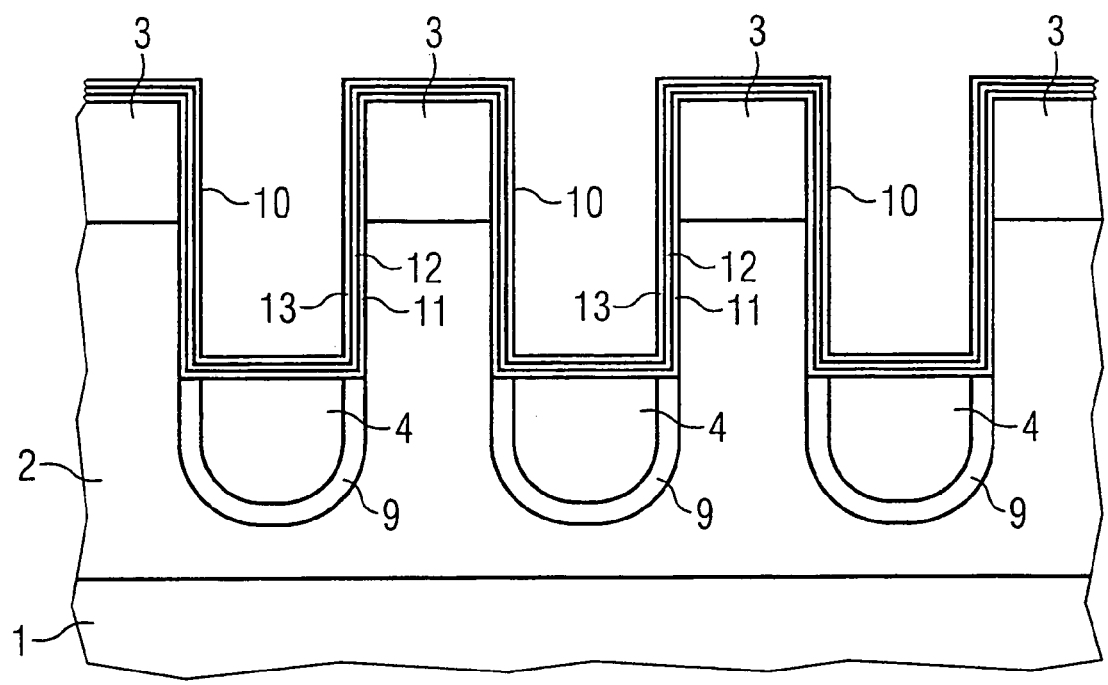
FIG. 7 shows the cross section of FIG. 6 after a later method step.

The cross section of FIG. 7 illustrates the intermediate product after the fabrication of the storage layer sequence 10 with the actual storage layer 12 between the boundary layers 11, 13. The storage layer sequence 10 also covers the top side of the first gate electrode 4. The storage layer 12 is for example silicon nitride, aluminum oxide or a different one of the materials suitable for charge trapping that were mentioned in the introduction. The upper boundary layer 13 may be formed for example by depositing an oxide layer or by fabricating an oxide layer by thermal oxidation of the nitride of the storage layer 12. The storage layer sequence 10 may then be patterned, for which a plurality of exemplary embodiments are described.

If the simplest possible process implementation is sought, the storage layer sequence 10 may remain over the whole area on the top side. Instead of this, the storage layer sequence may be removed in each case in the upper region of the trenches. This is done using a suitable auxiliary layer.

Figure 8:
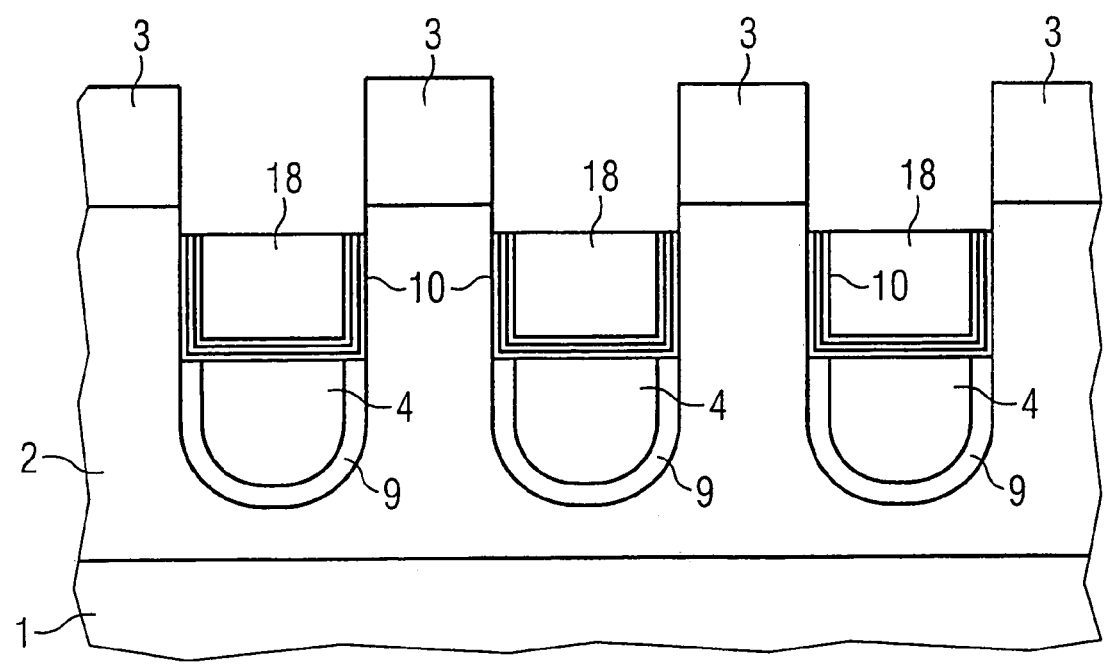
FIG. 8 shows a cross section through an intermediate product of an alternative fabrication method.

FIG. 8 shows a cross section corresponding to the cross section of FIG. 7, illustrating an auxiliary layer 18 that has been introduced into the trenches. The auxiliary layer is a material with respect to which the materials of the storage layer sequence can be selectively removed. FIG. 8 illustrates that the material of the storage layer sequence 10 has already been removed above the auxiliary layer 18. The auxiliary layer 18 is subsequently removed. The embodiment of the memory cell array in accordance with FIG. 1 is fabricated by means of this exemplary embodiment of the method.

Another possibility, proceeding from the intermediate product in accordance with FIG. 7, consists in carrying out a spacer etching by means of an anisotropic etching step, by means of which spacer etching the storage layer sequence 10 is removed on the top side of the semiconductor body 1 and on the top side of the first gate electrode 4 or the control gate lines within the trenches and residual portions remain, in the process, in the manner of sidewall spacers at the lateral trench walls. The exemplary embodiment in accordance with FIG. 3 is fabricated by means of this variant of the fabrication method. A further layer made of a dielectric 8 is then applied in order to insulate the first gate electrode from the second gate electrode, which further layer also electrically insulates the source/drain regions 3 from the word lines that are subsequently to be applied. The dielectric 8 may again be an oxide.

Once the storage layer sequence 10 has thus been fabricated and, if appropriate, patterned, a further electrically conductive material is introduced into the trenches, which material is provided for the formation of the word lines 6. This material is preferably polysilicon. It is preferably supplemented with a metal layer or a metal/metal silicide layer on the top side. The material is then patterned to form the word lines 6 and, if appropriate, the conductor strips 7 present thereon. That portion of the material of the word lines which is introduced into the trenches thus forms the second gate electrodes 5. However, it is also possible for a separate material to be introduced for the second gate electrodes 5. This material is then planarized on the top side, so that the material of the word line 6 may firstly be applied over the whole area and subsequently be patterned. An electrically insulating material is introduced between the second gate electrodes 5, which succeed one another in the longitudinal direction of the trenches, for the purpose of isolating adjacent memory cells. The top side may also be planarized with the electrically insulating material. At the trench bottoms, the material of the first gate electrodes 4 forms control gate lines that run continuously in the longitudinal direction of the trenches. The doped regions that form the source/drain regions are uninterrupted along the trenches and form the bit lines or source/drain lines $S/D_n$ in this way.

In order to fabricate the terminal contacts 14 illustrated in FIG. 4 on the control gate lines, electrically conductive material is deposited into the trenches at the edge of the memory cell array, the material forming an electrical contact 15 with the material of the control gate lines. For this purpose, the electrically conductive material deposited into the trenches, which is provided for the second gate electrodes 5, may firstly be removed from the trenches at the edge of the memory cell array using a mask. This is done by means of an isotropic etching, for example. Afterward, the dielectric layer (portion of the storage layer sequence 10 or further dielectric 8) is removed on the top side of the material of the control gate lines. This is done by means of an anisotropic etching step. A dielectric is filled in, in which contact holes are fabricated in the region of the contacts 15 to be fabricated. The contact holes are filled with electrically conductive material, preferably with polysilicon or a suitable metal, and patterned on the top side to form the terminal contacts. This results in the contact plugs illustrated in FIG. 4.

If a spacer etching for patterning the storage layer sequence 10 is effected in the course of the fabrication method proceeding from the intermediate product in accordance with FIG. 7, so that the top side of the first gate electrodes 4 or the control gate lines is thus uncovered, the dielectric 8, at the edge of the memory cell array, is preferably not applied to the top side of the control gate lines in the first place or is at least removed again there. With the introduction of the material provided for the second gate electrodes 5, therefore, contacts 15 are fabricated directly at the edge of the memory cell array. The electrically conductive material introduced therefore only needs to be suitably patterned in order to form the contact plugs. A corresponding spacer etching may also remain restricted to the edge of the memory cell array. The memory cells themselves may then remain provided with a whole-area storage layer sequence, or the embodiment in accordance with FIG. 1 is fabricated in the region of the memory cell array. The spacer etching then serves only for uncovering the top side of the control gate lines in the region of the edge of the memory cell array. In principle, however, other connection possibilities are also possible, in particular integrated in the semiconductor material instead of on the top side of the component, which are used for electrically conductively connecting the control gate lines to the assigned terminals of the driving periphery. The relevant terminal may be formed within the semiconductor body in the case of a drive circuit integrated in the semiconductor material.

The advantages of the invention are the generation of a very high lateral electric field, at the important position with respect to the memory region, to be precise in a self-aligned manner on the basis of the structure of the memory cells; furthermore a significantly reduced programming current (reduction by as much as a factor of 40) and also a higher read current than in conventional memory cells with trench transistors, since a particularly thin gate dielectric can be used in the region below the first gate electrodes; and the possibility of storing two separate bits per memory cell even when the individual cell has very small lateral dimensions.

What is claimed is:

1. A charge trapping memory cell comprising:
a well in a semiconductor body, said well being doped to a first conductivity type,
a source region and a drain region formed at a top side of the semiconductor body and doped to a second conductivity type tat is opposite the first conductivity type;
a trench formed in the semiconductor body, said trench extending into the doped well below the source and drain regions;
a first gate electrode located at least in a bottom portion of the trench, said first gate electrode electrically insulated from the well by a gate dielectric;
a second gate electrode extending into the trench toward said first gate electrode and arranged in the trench above the first gate electrode and electrically insulated from the first gate electrode; and
a storage layer sequence comprising first and second boundary layers and a storage layer, said storage layer provided for charge trapping being sandwiched between said first and second boundary layers, and at least portions of the storage layer sequence being arranged between the second gate electrode and the doped well and/or between the second gate electrode and the source and drain regions.

2. The charge trapping memory cell of claim 1 and further comprising:
a word line coupled to the second gate electrode;
source/drain lines coupled to the source and drain regions; and
a control gate coupled to the first gate electrode.

3. The charge trapping memory cell as claimed in claim 1, wherein the first gate electrode and the second gate electrode are insulated from one another by a portion of the storage layer sequence.

4. The charge trapping memory cell as claimed in claim 1, wherein a portion of the storage layer sequence reaches as far as an upper edge of the first gate electrode.

5. The charge trapping memory cell of claim 1, wherein the storage layer sequence comprises a nitride layer sandwiched between first and second oxide layers.

6. The charge trapping memory cell of claim 1, wherein the gate electrode comprises polysilicon.

7. The charge trapping memory cell of claim 1, wherein the semiconductor body comprises a semiconductor substrate.

8. The charge trapping memory cell of claim 1, wherein portions of the storage layer sequence are arranged between the second gate electrode and the doped well.

9. The charge trapping memory cell of claim 8, wherein portions of the storage layer sequence are arranged between the second gate electrode and the source and drain regions.

10. The charge trapping memory cell of claim 1, wherein portions of the storage layer sequence are arranged between the second gate electrode and the source and drain regions.

11. A charge trapping memory cell comprising:
a well in a semiconductor body, said well being doped to a first conductivity type,
a source region and a drain region formed at a top side of the semiconductor body and doped to a second conductivity type that is opposite the first conductivity type;
a trench formed in the semiconductor body, said trench extending into the doped well below the source and drain regions;
a gate electrode, which is electrically insulated from the well by a gate dielectric, the gate electrode being arranged as a first gate electrode in the trench and at least in a bottom portion of the trench;
a second gate electrode arranged in the trench above the first gate electrode and electrically insulated from the first gate electrode; and
a storage layer sequence comprising first and second boundary layers and a storage layer, said storage layer provided for charge trapping being sandwiched between said first and second boundary layers, and at least portions of the storage layer sequence being arranged between the second gate electrode and the doped well and other portions being arranged between the second gate electrode and the source and drain regions.

12. A charge trapping memory cell comprising:
a well in a semi conductor body, said well being doped to a first conductivity type,
a source region and a drain region formed at a top side of the semiconductor body and doped to a second conductivity type that is opposite the first conductivity type;
a trench formed in the semiconductor body, said trench extending into the doped well below the source and drain regions;
a gate electrode, which is electrically insulated from the well by a gate dielectric, the gate electrode being arranged as a first gate electrode in the trench and at least in a bottom portion of the trench;
a second gate electrode arranged in the trench above the first gate electrode and electrically insulated from the first gate electrode; and
a storage layer sequence comprising first and second boundary layers and a storage layer, said storage layer provided for charge trapping being sandwiched between said first and second boundary layers, and at least a portion of the storage layer sequence providing said electrical insulation between said first gate electrode and said second electrode, and another portion being arranged between the second gate electrode and the doped well and/or between the second gate electrode and the source and drain regions.

13. The charge trapping memory cell of claim 12 and further comprising:
a word line coupled to the second gate electrode;
source/drain lines coupled to the source and drain regions; and
a control gate coupled to the first gate electrode.

14. The charge trapping memory cell as claimed in claim 12, wherein a portion of the storage layer sequence reaches as far as an upper edge of the first gate electrode.

15. The charge trapping memory cell of claim 12, wherein the storage layer sequence comprises a nitride layer sandwiched between first and second oxide layers.

16. The charge trapping memory cell of claim 12, wherein the gate electrode comprises polysilicon.

17. The charge trapping memory cell of claim 12, wherein the semiconductor body comprises a semiconductor substrate.

18. The charge trapping memory cell of claim 12, wherein portions of the storage layer sequence are arranged between the second gate electrode and the doped well.

19. The charge trapping memory cell of claim 18, wherein portions of the storage layer sequence are arranged between the second gate electrode and the source and drain regions.

20. The charge trapping memory cell of claim 12, wherein portions of the storage layer sequence are arranged between the second gate electrode and the source and drain regions.

* * * * *

UNITED STATES PATENT AND TRADEMARK OFFICE
CERTIFICATE OF CORRECTION

PATENT NO. : 7,227,219 B2
APPLICATION NO. : 11/055584
DATED : June 5, 2007
INVENTOR(S) : Mikolajick It is certified that error appears in the above-identified patent and that said Letters Patent is hereby corrected as shown below:

Column 9, line 7; delete "tat" insert --that--

Signed and Sealed this

Fourteenth Day of August, 2007

JON W. DUDAS
*Director of the United States Patent and Trademark Office*